(12) United States Patent
Price et al.

(10) Patent No.: US 11,075,027 B1
(45) Date of Patent: Jul. 27, 2021

(54) PERMANENT MAGNET FOR GENERATING HOMOGENOUS AND INTENSE MAGNETIC FIELD

(71) Applicant: Q Magnetics, LLC, Louisville, CO (US)

(72) Inventors: John C. Price, Longmont, CO (US); Hilton W. Chan, Aurora, CO (US)

(*) Notice: Subject to any disclaimer, the term of this patent is extended or adjusted under 35 U.S.C. 154(b) by 42 days.

(21) Appl. No.: 16/460,783

(22) Filed: Jul. 2, 2019

Related U.S. Application Data

(60) Provisional application No. 62/738,754, filed on Sep. 28, 2018, provisional application No. 62/693,794, filed on Jul. 3, 2018.

(51) Int. Cl.
*H01F 7/02* (2006.01)
*G01R 33/383* (2006.01)

(52) U.S. Cl.
CPC ............ *H01F 7/021* (2013.01); *H01F 7/0273* (2013.01); *G01R 33/383* (2013.01)

(58) Field of Classification Search
CPC ...... H01F 7/021; H01F 7/0273; G01R 33/383
See application file for complete search history.

(56) References Cited

U.S. PATENT DOCUMENTS

| | | | |
|---|---|---|---|
| 3,253,194 A | 5/1966 | Parker | |
| 3,437,963 A | 4/1969 | Gang et al. | |
| 4,093,912 A * | 6/1978 | Double | G01R 33/383 324/320 |
| 4,679,022 A * | 7/1987 | Miyamoto | H01F 7/0278 324/319 |
| 5,332,971 A | 7/1994 | Aubert | |
| 6,281,775 B1 * | 8/2001 | Rapoport | G01R 33/383 324/319 |
| 8,148,988 B2 | 4/2012 | Blumich et al. | |
| 8,847,596 B2 | 9/2014 | Price et al. | |
| 2017/0254866 A1 * | 9/2017 | Haenichen | G01R 33/383 |

OTHER PUBLICATIONS

F. Bloch et al., "Innovating Approaches to the Generation of Intense Magnetic Fields: Design and Optimization of a 4 Tesla Permanent Magnet Flux Source", IEEE Transactions on Magnetics, vol. 34, No. 5, pp. 2465-2468, Sep. 1998.
Rye, Jae Seop, et al., "3-D Optimal Shape Design of Pole Piece in Permanent Magnet MRI Using Parameterized Nonlinear Design Sensitivity Analysis", IEEE Transactions of Magnetics, vol. 42, No. 4, pp. 1351-1354, Apr. 2004.
Wang, Zheng, et al. "Design and Manufacture of a Near 3 T High Field Permanent Magnet Assembly", IEEE Transactions on Applied Superconductivity, vol. 22, No. 3, Jun. 2012, 4 pages.

* cited by examiner

*Primary Examiner* — Mohamad A Musleh
(74) *Attorney, Agent, or Firm* — James R. Young; Cochran Freund & Young LLC

(57) ABSTRACT

A permanent magnet assembly for generating a homogenous and intense magnetic field includes can be adjusted for both transverse and axial gradients after completed assembly while field inhomogeneity is being measured. Gaps between pole piece bodies and pole tips are adjustable to adjust the transverse and axial gradients in a space between the pole tips.

15 Claims, 9 Drawing Sheets

PERMANENT MAGNET FOR GENERATING HOMOGENOUS AND INTENSE MAGNETIC FIELD

BACKGROUND

Technical Field of the Invention

The present invention is related to permanent magnets, and more particularly to permanent magnets for creating homogenous and intense magnetic fields.

State of the Prior Art

Magnetic fields having very high homogeneity and intensity are needed for a variety of appliances, apparatus, and processes, including, for example, nuclear magnetic resonance (NMR) spectroscopy, x-ray dichroism measurements, magneto-optical measurements, Hall effect and other electronic transport measurements, and for test and calibration of magnetic field measuring. For example, in some such applications, specifications for homogeneity may require that the root-mean-square variation of the field magnitude not exceed one part per million (ppm) over the sample volume. Also, high intensity magnetic fields are advantageous, for example, in NMR spectroscopy where both sensitivity and spectral dispersion (separation of signals corresponding to different chemical groups) improve as the magnetic field strength increases. Historically, three types of magnets have been used for these and similar applications: electromagnets, superconducting magnets, and permanent magnets. However, there are problems with each of these types of magnets.

Electromagnets capable of generating magnetic field strengths (intensities) above one tesla (T) are massive, require substantial electrical power, and usually require cooling to remove heat generated in their resistive coils. Superconducting magnets achieve the highest fields of all common laboratory magnets, but they have to be regularly filled with expensive cryogenic liquids to keep the coil temperature below the superconducting transition temperature. Alternately, they can be cooled with dedicated cryogenic refrigerators, but such systems are costly to purchase and maintain, and they require substantial electrical power. Thus both electromagnets and superconducting magnets are unsuitable for many applications, including most portable applications and most desktop instrument applications.

Permanent magnets of smaller size can provide strong magnetic fields, but, while many variations in sizes, configurations, adjustability, stability, strength, and homogeneity have been developed, a goal of providing small permanent magnets with high homogeneity and high field strength that can be adjusted for both transverse and axial gradients after completed assembly while field inhomogeneity is being measured and that then reliably maintains the strength and homogeneity has been elusive.

The foregoing examples of the related art and limitations related therewith are intended to be illustrative and not exclusive. Other limitations of the related art and other examples of related art will become apparent to those of skill in the art upon a reading of the specification and a study of the drawings.

SUMMARY

The following embodiments and aspects thereof are described and illustrated in conjunction with systems, tools, and methods which are meant to be examples and illustrative, not limiting in scope. In various embodiments and implementations, one or more problems have been reduced or eliminated, while other embodiments are directed to other improvements and benefits.

In one embodiment, a permanent magnet assembly comprises: (a) a pole tip assembly comprising two pole tips of magnetic material, disposed symmetrically with respect to a mirror plane between them, and a pole tip mount of rigid material, whereby said pole tips and pole tip mount together comprise a rigid assembly; (b) a first polarizing assembly comprising permanent magnets disposed to draw magnetic flux out of a first side of said pole tip assembly, and an enclosing magnetic flux return disposed to guide flux into a second polarizing assembly; (c) said second polarizing assembly comprising permanent magnets disposed to insert magnetic flux into a second side of said pole tip assembly, and an enclosing magnetic flux return disposed to guide flux out of said first polarizing assembly; and (d) adjusting means whereby the position of said first polarizing assembly and the position of said second polarizing assembly can be adjusted relative to the position of said pole tip assembly.

Another embodiment is a magnet apparatus that comprises: (a) a first magnet and a second magnet positioned adjacent to each other and aligned with each other in a manner that produces a magnetic flux along a longitudinal axis that extends through both the first magnet and the second magnet; (b) a first pole piece with a first pole piece face and a second pole piece with a second pole piece face, wherein the first pole piece and the second pole piece are positioned between the first magnet and the second magnet with the first pole piece face and the second pole piece face facing each other a spaced distance apart from each other in the magnetic flux along the longitudinal axis so that there is a space between the first pole piece face and the second pole piece face, and wherein there is a first gap between the first magnet and the first pole piece face and there is a second gap between the second magnet and the second pole piece face; and (c) adjusting means for adjusting the size or shape of the first gap or the second gap.

In another embodiment, a method of providing a magnetic field comprises: (a) creating a magnetic flux along an axis; (b) positioning a first pole piece comprising a first pole piece body and a first pole piece tip that has a first pole piece tip face in the magnetic flux with a first gap between the first pole piece body and the first pole piece tip; (c) positioning a second pole piece comprising a second pole piece body and a second pole piece tip that has a second pole piece tip face in the magnetic flux with a second gap between the second pole piece body and the second pole piece tip; and (d) adjusting homogeneity of the magnetic flux in the space between the first pole piece tip face and the second pole piece tip face by varying the first gap or by varying the second gap or by varying both the first gap and the second gap.

In addition to the example aspects, embodiments, and implementations described above, further aspects, embodiments, and implementations will become apparent to persons skilled in the art after becoming familiar with the drawings and study of the following descriptions.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting. In the drawings.

DETAILED DESCRIPTIONS OF EXAMPLE EMBODIMENTS

Figure 1:
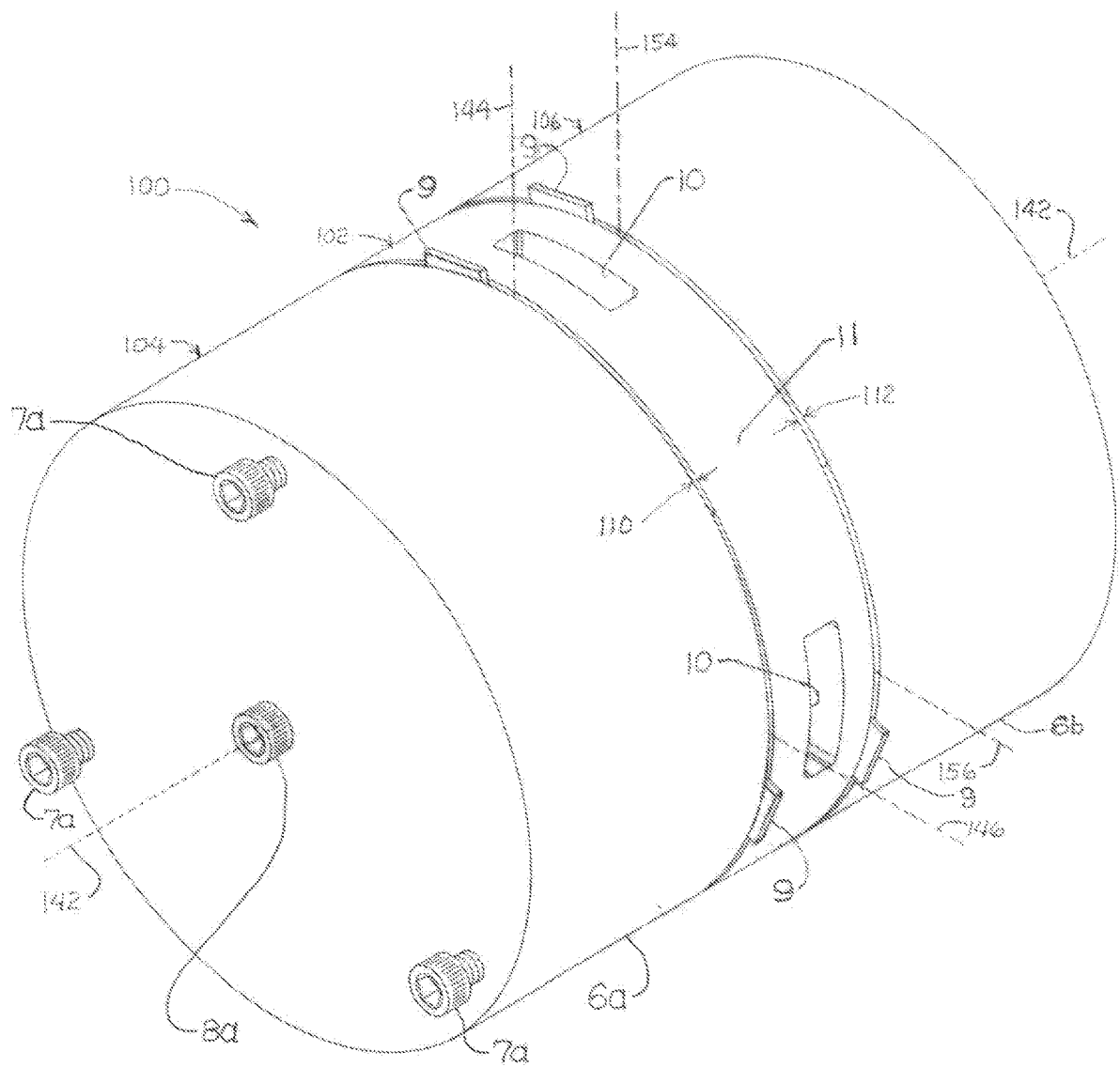
FIG. 1 is an isometric view of an example magnet assembly that is adjustable for both transverse magnetic gradients and axial magnetic gradients.

An example magnet assembly 100 shown in FIG. 1 is adjustable for both transverse magnetic gradients and axial magnetic gradients in a robust and stable manner to provide and maintain high homogeneity and high field permanent magnets as explained in more detail below. The example magnet assembly 100 comprises a first polarizing assembly 104 and a second polarizing assembly 106 axially aligned with each other on opposite sides of a pole tip assembly 102. The two polarizing assemblies 104, 106 are spatially adjustable in relation to each other and in relation to the pole tip assembly 102 for adjusting the transverse magnetic gradients and the axial magnetic gradients in a space 103 between interfacing pole piece tips (not shown in FIG. 1) in the pole tip assembly 102, as will be explained in more detail below. A plurality of jack screws 7a in the first polarizing assembly 104 are adjustable in a manner that adjusts the first polarizing assembly 104 in spatial relation to the pole tip assembly 102. Similarly, a plurality of jack screws 7b (see FIGS. 3-6) are adjustable in a manner that adjusts the second polarizing assembly 106 in spatial relation to the pole tip assembly 102. These spatial relation adjustments provide both transverse and axial adjustments as will be explained in more detail below. Optional shims 9 can be used to maintain spacings 110, 112, respectively, between the first polarizing assembly 104 and the pole tip assembly 102 and between the second polarizing assembly 106 and the pole tip assembly 102. A plurality of access ports 10 in the flux return center section 11 of the pole tip assembly 102 provide access from the exterior of the pole tip assembly 102 to the space 103 (see FIG. 5) between interfacing pole piece tips 1a, 1b inside the pole tip assembly 102, e.g., for inserting magnetic flux sensing tools and measurement samples into that space 103.

Figure 4:
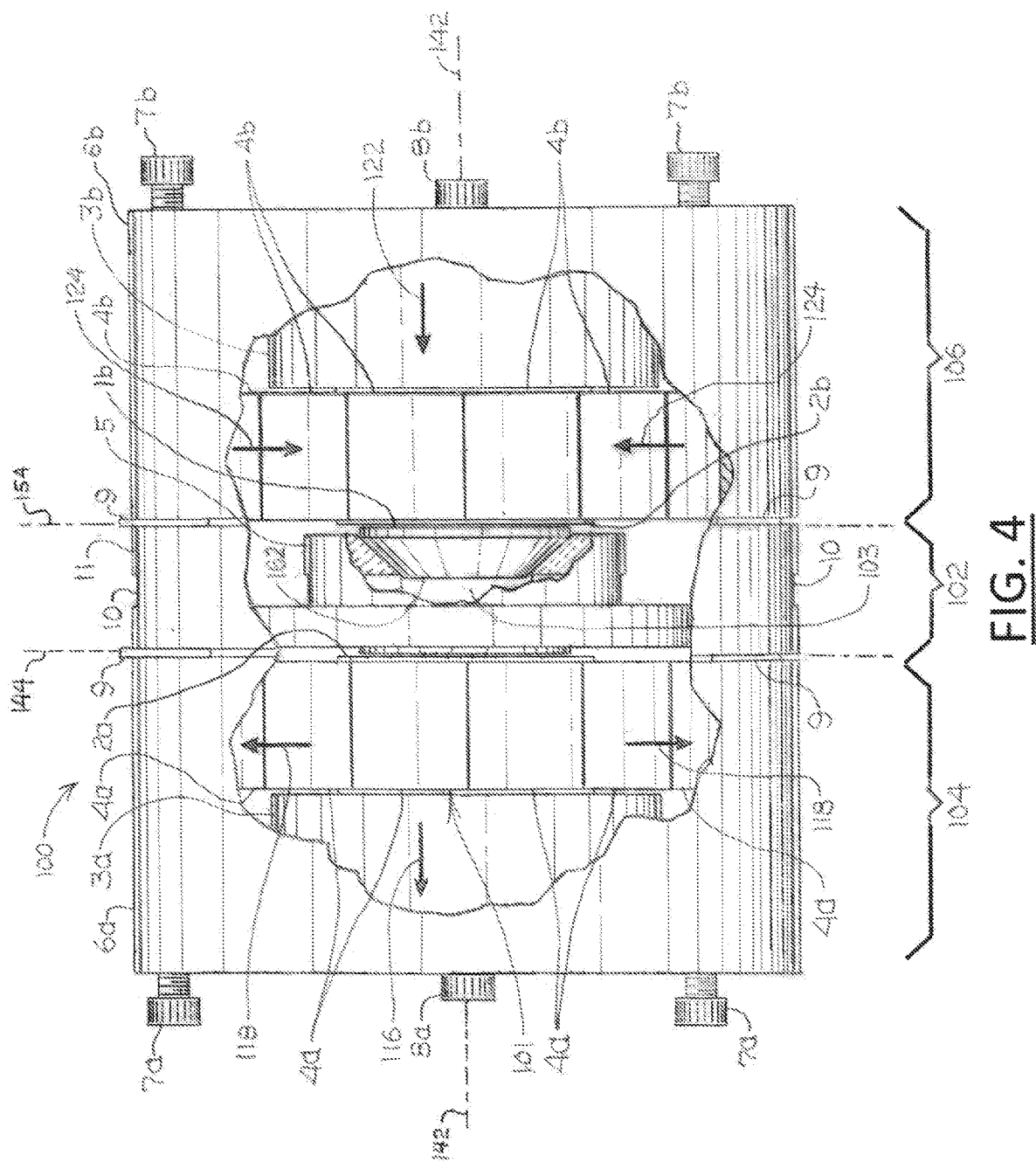
FIG. 4 is a side elevation view of the example magnet assembly similar to FIG. 3, but with portions of the flux return sections cut away to reveal internal components of the polarizing assemblies and the pole tip assembly, a portion of which is also cut away to reveal a pole piece tip mounted in the pole tip assembly.
Figure 5:
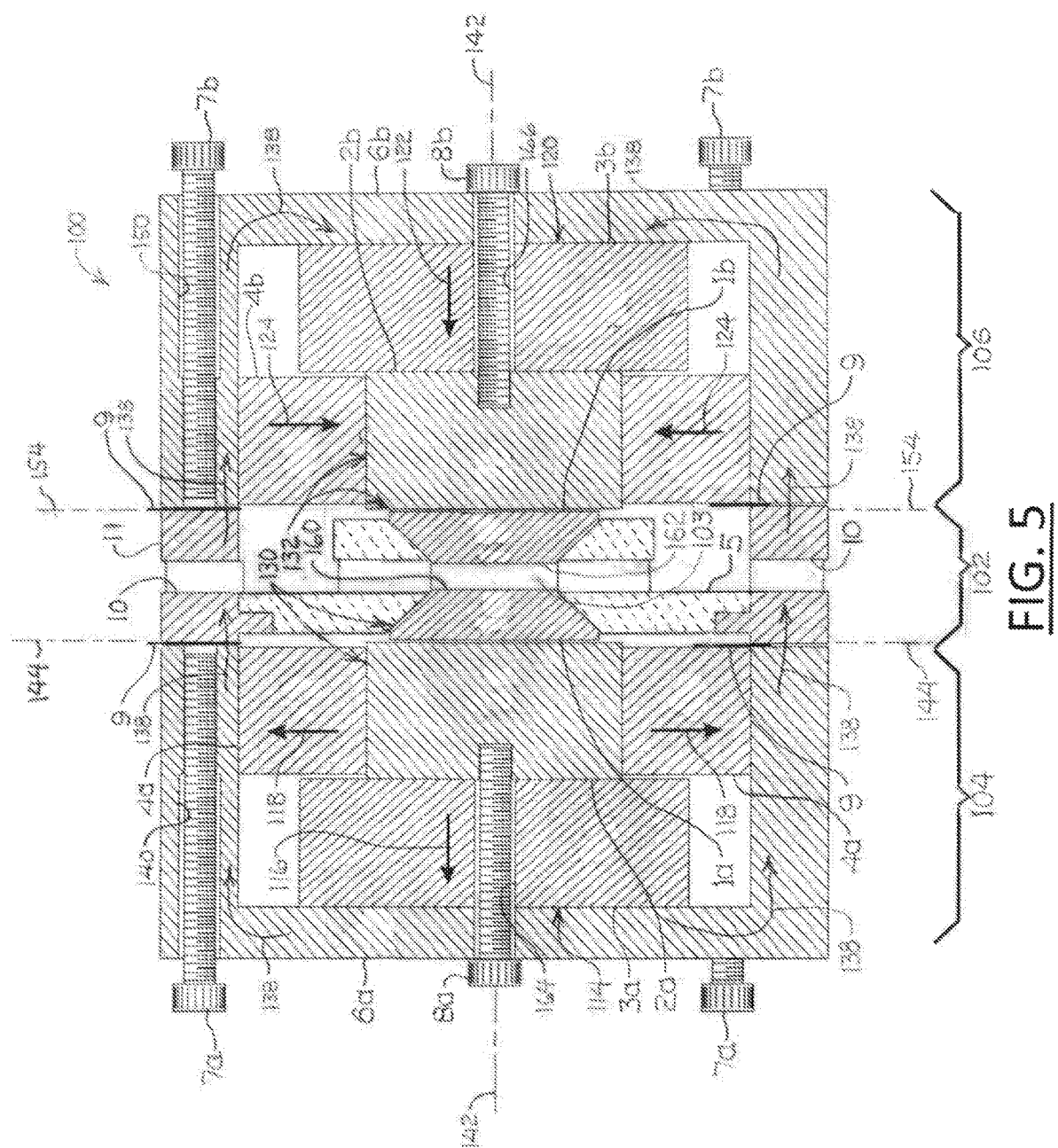
FIG. 5 is a cross-section view of the example magnet assembly taken along the cutting plane line 5-5 in FIG. 3.
Figure 6:
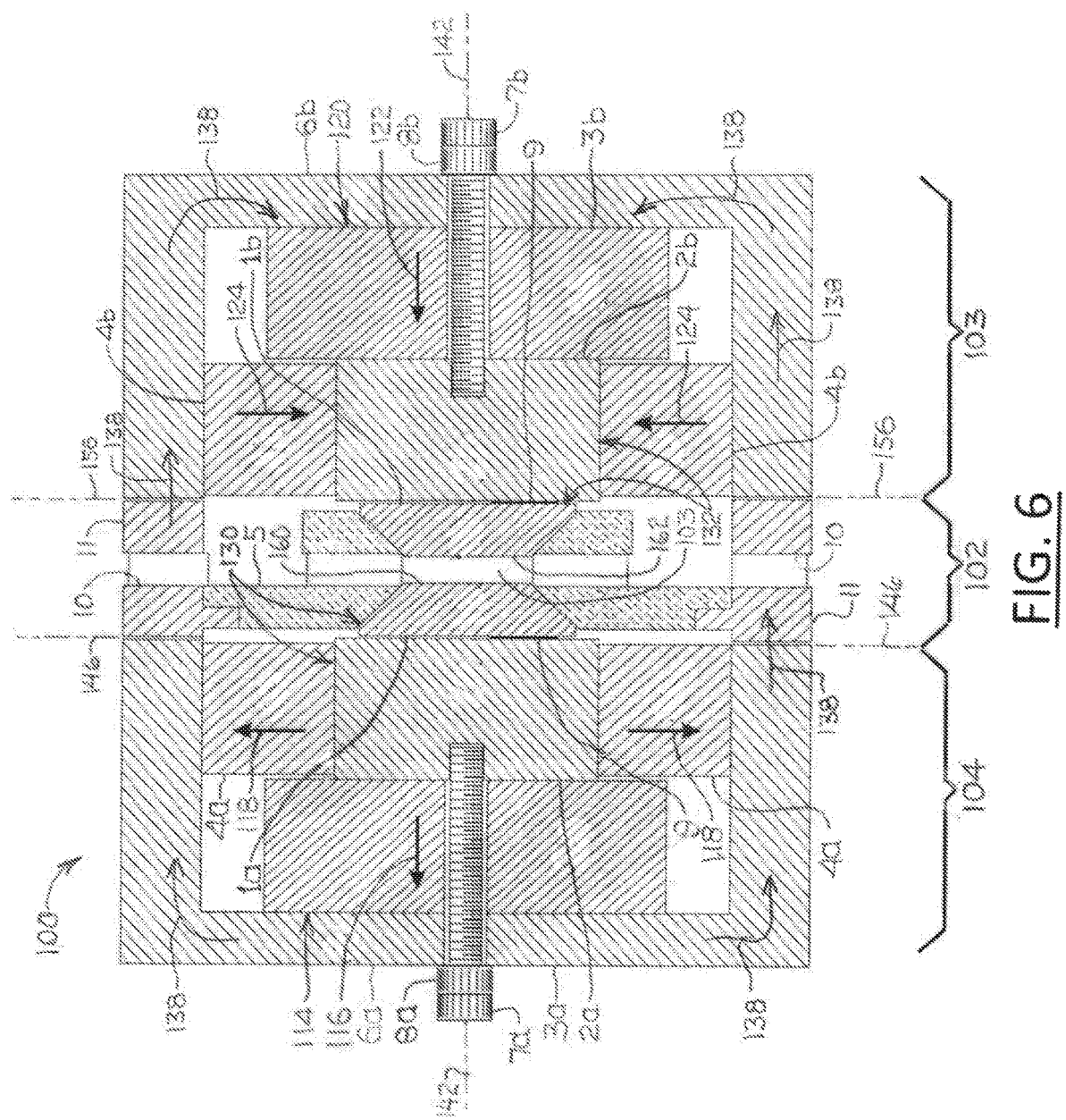
FIG. 6 is a cross-section view of the example magnet assembly taken along the cutting plane line 6-6 in FIG. 3.
Figure 7:
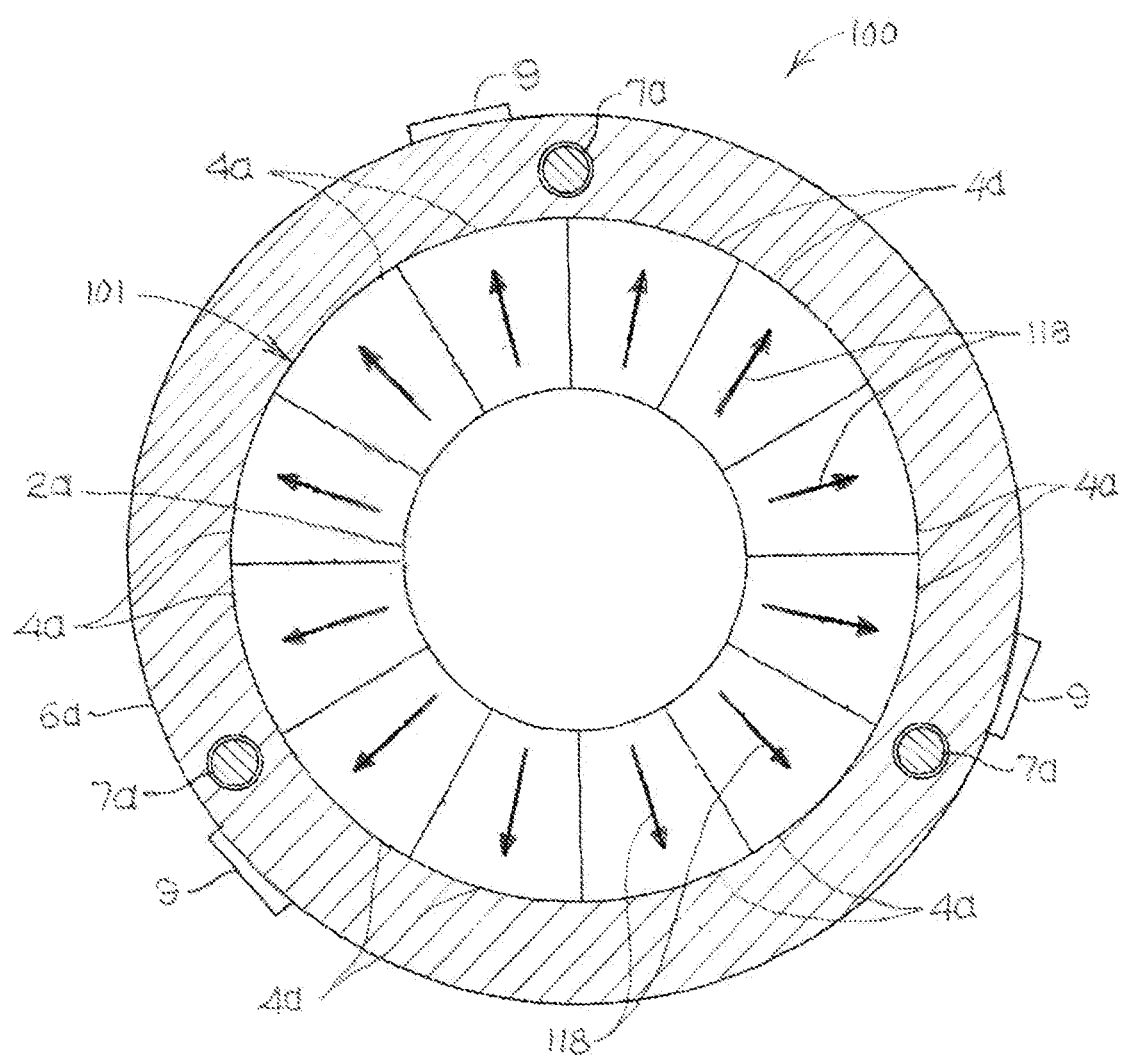
FIG. 7 is a cross-section view of the example magnet assembly taken along the cutting plane line 7-7 in FIG. 2.

With reference now primarily to FIGS. 4 and 5, the first polarizing assembly 104 comprises a first permanent magnet unit 114, which, in the example magnet assembly 100, comprises a first disk magnet 3a and a plurality of first magnet sectors 4a arranged as a first ring magnet structure 101 (see FIG. 7). The first disk magnet 3a is axially magnetized in one axial direction as indicated by the axial flux arrow 116, and the magnet sectors 4a are magnetized radially outward as indicated by the radial flux arrows 118. Similarly, the second polarizing assembly 106 comprises a second permanent magnet unit 120, which, in the example magnet assembly 100, comprises a second disk magnet 3b and a plurality of second magnet sectors 4b arranged as a second ring magnet structure 105 (see FIG. 9). The second disk magnet 3b is axially magnetized in the same axial direction as the first disk magnet 3a as indicated by the axial flux arrow 122, and the magnet sectors 4b are magnetized radially inward as indicated by the radial flux arrows 124 in FIGS. 4 and 5.

Referring now primarily to FIG. 5, a first pole piece 130 in the example magnet assembly 100 comprises a first pole piece body 2a in the first polarizing assembly 104 and a first pole piece tip 1a in the pole tip assembly 102. Similarly, a second pole piece 132 in the example magnet assembly 100 comprises a second pole piece body 2b in the second polarizing assembly 106 and a second pole piece tip 1b in the pole tip assembly 102. The first pole piece tip 1a and the second pole piece tip 1b are mounted in the pole tip assembly 102 in immovable, facing relation to each other with a fixed space 103 between them. Accordingly, with the first pole piece body 2a mounted in the first polarizing assembly 104, the second pole piece body 2b mounted in the second polarizing assembly 106, and the first and second pole piece tips 1a, 1b mounted in the pole tip assembly 102, the first pole piece tip 1a is adjustably moveable along with the pole tip assembly 102 in spatial relation to the first pole piece body 2a, and the second pole piece tip 1b is adjustably moveable along with the pole tip assembly 102 in spatial relation to the second pole piece body. In other words, the pole tip assembly 102, including the first pole piece tip 1a and the second pole piece tip 1b, is adjustably moveable in relation to both the first polarizing assembly 104 and the second polarizing assembly 106, while the first and second pole piece tips 1a, 1b are immovable in fixed spatial relation to each other with the fixed space 103 between them. A cylindrical first flux return 6a encloses the first polarizing assembly 104, except on the interior end of the first polarizing assembly 104 that faces the pole tip assembly 102, and a cylindrical second flux return 6b encloses the second polarizing assembly 106, except on the interior end of the second polarizing assembly 106 that faces the pole tip assembly 102. A ring-like flux return center section 11 surrounds the periphery of the pole tip assembly 102. Accordingly, the magnetic flux emanating from the first and second permanent magnet units 114, 120 is guided efficiently from one end of the magnet assembly 100 to the other by the first flux return 6a, the flux return center section 11, and the second flux return 6b, as indicated by the flux return arrows 138, while minimizing stray flux outside the magnet assembly 100.

Figure 2:
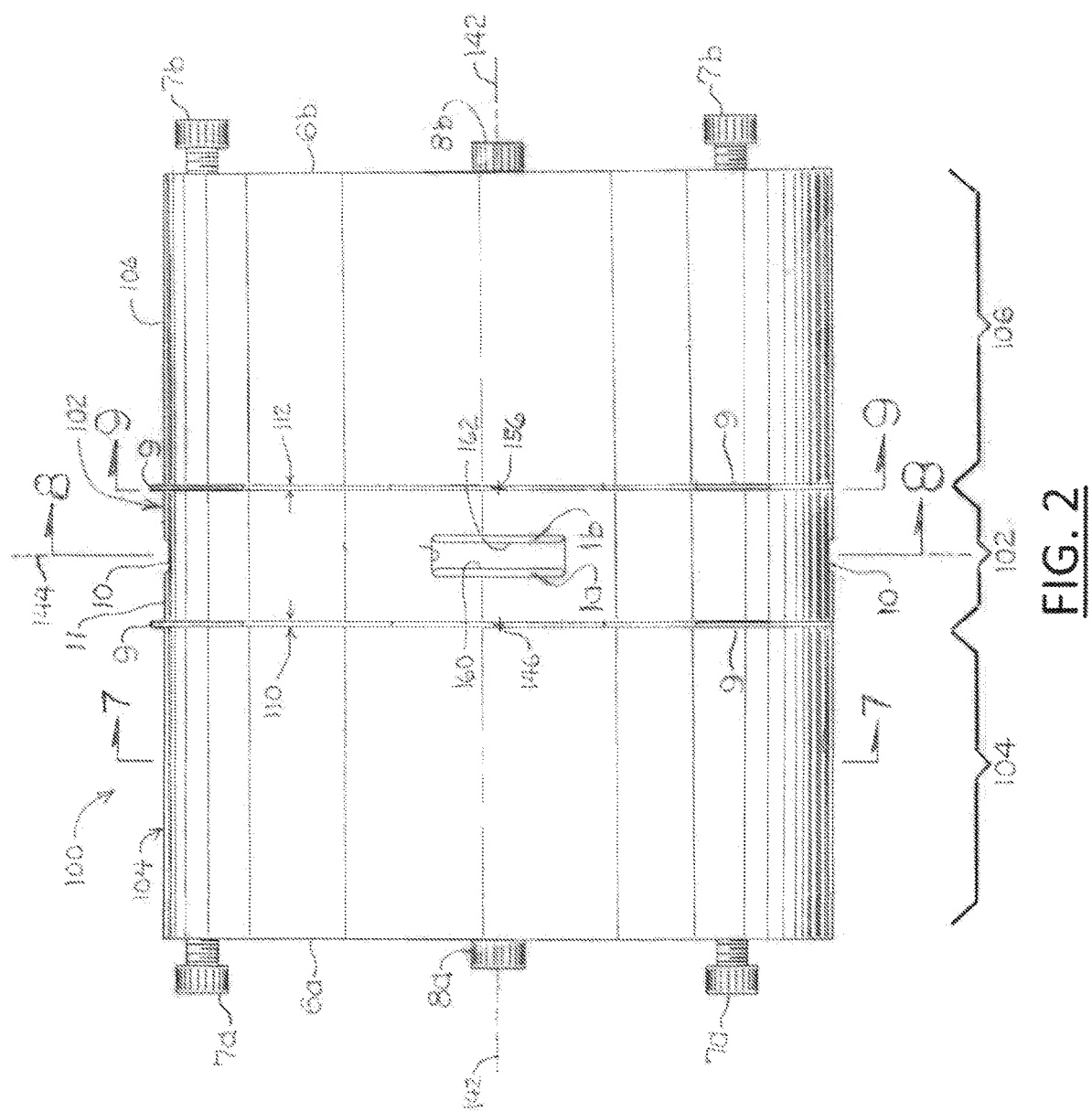
FIG. 2 is a side elevation view of the example magnet assembly of FIG. 1.

The magnetic forces of the first permanent magnet unit 114 and the second permanent magnet unit 120 hold the first polarizing assembly 104, the pole tip assembly 102, and the second polarizing assembly 106 strongly and tightly together. The three jack screws 7a in the first polarizing assembly 104 extend through, and are threaded in, holes 140 in the first flux return 6a of the first polarizing assembly 104, thus can be screwed individually against the pole tip assembly 102 to adjustably move the first polarizing assembly 104 and the pole tip assembly 102 spatially apart from each other. Therefore, screwing the jack screws 7a against the pole tip assembly 102 moves the first pole piece body 2a and the first pole piece tip 1a spatially apart from each other. As shown in FIGS. 1 and 2, the plurality of jack screws 7a (three jack screws 7a in the example magnet assembly 100 shown in FIGS. 1-8) are spaced angularly apart from each other with respect to the longitudinal axis 142 of the magnet assembly 100 so that jack screws 7a can be screwed inwardly or outwardly against the pole tip assembly 102 in amounts and in combinations that enable movement of the first polarizing assembly 104 in relation to the pole tip assembly 102 axially along the longitudinal axis 142, rotationally about a first orthogonal vertical axis 144, or rotationally about a first orthogonal horizontal axis 146 (see FIGS. 1 and 6), or any combination of those movements. Therefore, such adjustments of the jack screws 7a also result in corresponding movement of the first pole piece body 2a in relation to the first pole piece tip 1a along the longitudinal axis 142, rotationally substantially about the first orthogonal vertical axis 144, or rotationally substantially about the first orthogonal horizontal axis 146, or any combination of those movements, which thereby adjust the gradients of the magnetic field to improve field homogeneity in the space 103 between the first pole piece tip 1a and the second pole piece tip 1b.

Similarly, the three jack screws 7b in the second polarizing assembly 106 (see FIGS. 5, 6, and 9) extend through, and are threaded in, holes 150 in the second flux return 6b of the second polarizing assembly 106, thus can be screwed individually against the pole tip assembly 102 to adjustably move the second polarizing assembly 106 and the pole tip assembly 102 spatially apart from each other. Therefore, screwing the jack screws 7b against the pole tip assembly 102 moves the second pole piece body 2b and the second pole piece tip 1b spatially apart from each other. The plurality of jack screws 7b (three jack screws 7b in the example magnet assembly 100 shown in FIGS. 1-8) are spaced angularly apart from each other with respect to the longitudinal axis 142 of the magnet assembly 100, similar to the angular spacing of the jack screws 6a, so that jack screws 7b can be screwed inwardly or outwardly against the pole tip assembly 102 in amounts and in combinations that enable movement of the second polarizing assembly 106 in relation to the pole tip assembly 102 along the longitudinal axis 142, rotationally about a second orthogonal vertical axis 154, or rotationally about a second orthogonal horizontal axis 156, or any combination of those movements. Therefore, such adjustments of the jack screws 7b also result in corresponding movement of the second pole piece body 2b in relation to the second pole piece tip 1b along the longitudinal axis 142, rotationally about the second orthogonal vertical axis 154, or rotationally about the first orthogonal horizontal axis 156, or any combination of those movements, which thereby adjust the gradients of the magnetic field to improve field homogeneity in the space between the first pole piece tip 1a and the second pole piece tip 1b.

As mentioned above, access ports 10 are provided to enable flux measuring instrumentation or samples to be measured or analyzed (not shown) to be inserted into the space 103 between the first and second pole piece tips 1a, 1b inside the magnet assembly 100 for measuring the magnetic gradient in that space 103 as the adjustments with the jack screws 7a, 7b are made. As an option, to hold the adjusted spacings between the first polarizing assembly 104 and the pole tip assembly 102, or between the second polarizing assembly 106 and the pole tip assembly 102, one or more shims 9 can be positioned in those spaces. With such shims 9 in such positions, the jack screws 7a, 7b can be backed away from the pole tip assembly 102, and the magnetic force between the first polarizing assembly 104, the pole tip assembly 102, and the second polarizing assembly 106 press those components tightly on the shims 9 and hold the shims 9 in those positions.

Two of the four access ports 10 providing access to the space 103 in the center of the magnet assembly 100 and four of the six shims 9 used for adjustment can be seen in FIG. 1. Some components of the example magnet assembly 100, including the pole piece tips 1a, 1b and the pole piece bodies 2a, 2b, have rotational symmetry about the longitudinal axis 142. Other embodiments may be rotationally asymmetric. Some components in the example magnet assembly 100 embodiment have a reflection symmetry about the plane of section plane 8-8. Other embodiments may lack this reflection symmetry.

The pole piece tips 1a, 1b can be made of soft magnetic material which is saturated in some regions. In the example magnet assembly 100 embodiment, the pole piece tips 1a, 1b are made of the iron-cobalt alloy known as permendur, but in other embodiments the pole piece tips 1a, 1b may be made of iron, steel, or of other soft magnetic material. Also in other embodiments, the pole piece tips 1a, 1b may be unsaturated everywhere. The pole piece tips 1a, 1b are rigidly supported by the pole tip mount 5 with the respective flat, circular faces 160, 162 of the pole piece tips 1a, 1b substantially parallel to each other and coaxial with each other, for example, on the longitudinal axis 142. In other embodiments the pole piece tip faces 160, 162 may be non-planar with a reflection symmetry plane between the faces. The pole tip mount 5 is made from a substantially non-magnetic material such as aluminum, titanium, or a ceramic. The four access ports 10 are provided in both the flux return center section 11 and in the pole mount 5 so that samples or other measurement apparatus can be moved into the space 103 in the center of the magnet assembly 100 between the two pole piece tip faces 160, 162. In other embodiments at least one access port is provided. In FIG. 2 the very ends of the pole piece tips 1a, 1b can be seen through the access ports 10 and pole tip mount 5, but this may not be the case in other embodiments. The pole mount 5 is a single piece that only appears split into two parts in FIGS. 5, 6, and 8 because the plane of these figures includes the access ports. In other embodiments the pole tip mount 5 can be formed from a plurality of parts, so long as the pole piece tips 1a, 1b and pole mount 5 together comprise a rigid assembly. The pole piece tips 1a, 1b, the pole mount 5, and the flux return center section 11 together form a rigid pole tip assembly 102. The pole tip assembly 102 can be constructed with the poles piece tips 1a, 1b accurately coaxial and parallel while in unmagnetized condition so that magnetic forces do not complicate manufacturing.

The remainder of the example magnet assembly embodiment 100 shown in FIGS. 1-9 is comprised of the two similar polarizing assemblies 104, 106, which are nearly mirror images of one another, but differ in the directions of the magnetizations of their permanent magnet components as explained above. The first polarizing assembly 104 comprises the first pole piece body 2a, the first permanent magnet sectors 4a, the first disk magnet 3a, the first flux return 6a, the first jack screws 7a, and the first center bolt 8a, while the second polarizing assembly is comprised of the second pole piece body 2b, the second permanent magnet sectors 4b, the second magnet disk 3b, the second flux return 6b, the second jack screws 7b, and the second center bolt 8b.

The pole piece bodies 2a, 2b in the example magnet assembly 100 can be made of permendur soft magnetic material. In other embodiments the pole piece bodies 2a, 2b may be made of iron, steel, or other soft magnetic materials. The pole piece bodies 2a, 2b contain tapped holes on axis 142 for bolts 8a, 8b. These bolts 8a, 8b are used to hold the pole piece bodies 2a, 2b, respectively, in place against magnetic forces during construction of each polarizing assembly 104, 106 and in the final assembly. In other embodiments other means may be used for such securement.

A plurality of permanent magnet sectors 4a, 4b comprise ring magnets 101, 105, respectively (see FIGS. 7 and 9), with substantially radially directed magnetization as explained above. In the illustrated embodiment each ring magnet 101, 105 is comprised of 12 magnet sectors 4a, 4b, respectively, and each magnet sector 4a, 4b can be made of the hard magnetic material NbFeB. In other embodiments different numbers of magnet sectors may be used, or each ring magnet may be constructed from a single permanent magnet with radial magnetization. In other embodiments the permanent magnet material may be NeFeB, SmCo, other rare-earth ceramic material or other permanent magnet material.

Each polarizing assembly 104, 106 comprises an axially magnetized disk magnet 3a, 3b, respectively, which can be made of the hard magnetic material NdFeB. In other embodiments the disk magnets 3a, 3b may be made of NeFeB, SmCo, other rare-earth ceramic material or other permanent magnet material. Each disc magnet 3a, 3b has a hole 164, 166, respectively, along the central axis 142 to clear the central bolts 8a, 8b. In other embodiments where other means are used for such securement, these holes may be absent, or additional holes may be present.

Each polarizing assembly 104, 106 is enclosed by the respective flux returns 6a, 6b. Persons skilled in the art will understand that the flux return center section 11 also functions as a part of the entire flux return, and that the purpose of the entire flux return is to guide magnetic flux efficiently from one end of the magnet assembly to the other, while minimizing stray flux outside the magnet assembly 100. The flux returns 6a, 6b can be made of low carbon steel, a soft magnetic material, but may be made of iron or other soft magnetic material in other embodiments. The flux returns 6a, 6b may be comprised of separate pieces to facilitate magnet assembly.

In FIGS. 4-7 and 9, the arrows indicate the direction of magnetization of the permanent ring and disk magnets. In the first polarizing assembly 104, the ring magnet 101 magnetization is radially outwards as indicated by arrows 118, while the disk magnet 3a magnetization is axial and directed away from the pole tip assembly 102 as indicated by the arrow 116. In the second polarizing assembly 106, the ring magnet 105 magnetization is radially inwards as indicated by the arrows 124, while the disk magnet 3b magnetization is axial and directed towards the pole tip assembly 102 as indicated by the arrow 122. Persons skilled in the art will recognized that polarizing assemblies with these magnetization directions will draw flux out of the pole tip assembly 102 on its left side, and insert flux into the pole tip assembly 102 on its right side, such that an intense and substantially uniform magnetic field directed to the left will be created in the space 103 between the pole tip faces 160, 162. Persons skilled in the art will also understand that the entire flux return 6a, 11, 6b will guide flux from the left side of the magnet assembly 100 back to the right side, and that reversing the direction of all magnetization will only change the direction of the intense field between the pole tip faces 1a, 1b.

Figure 8:
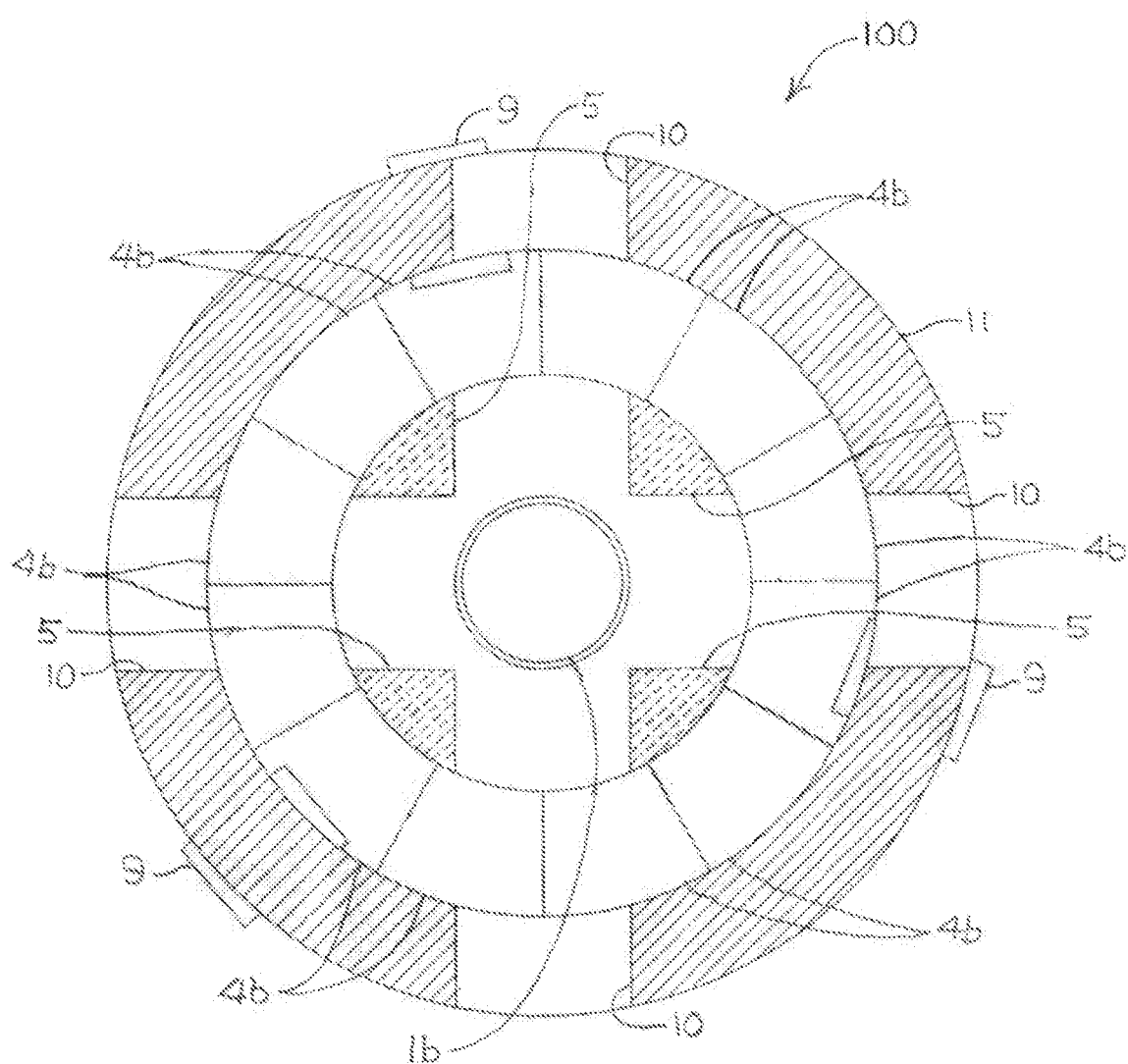
FIG. 8 is a cross-section view of the example magnet assembly taken along the cutting plane line 8-8 in FIG. 2.

FIG. 8 is section plane 8-8 in FIG. 2 along the central radial plane of the magnet assembly 100. The very end of the pole piece tip 1b is protruding out of the pole piece tip mount 5. The channels in the pole piece tip mount 5 that allow access to the space 103 in the center of the magnet assembly 100 are now visible and form a cross around the pole piece tip 1b. Beyond the pole tip mount 5, the ring magnet 101 sectors 4b can be partially seen.

FIG. 7 shows a view in the axial direction of the first ring magnet 101 of the first polarizing assembly 104. In the example magnet assembly 100 embodiment, the first ring magnet comprises twelve (12) first sectors 4a, each with substantially uniform magnetization. Also shown in FIG. 7 are the first pole piece body 2a and the first flux return 6a.

Figure 9:
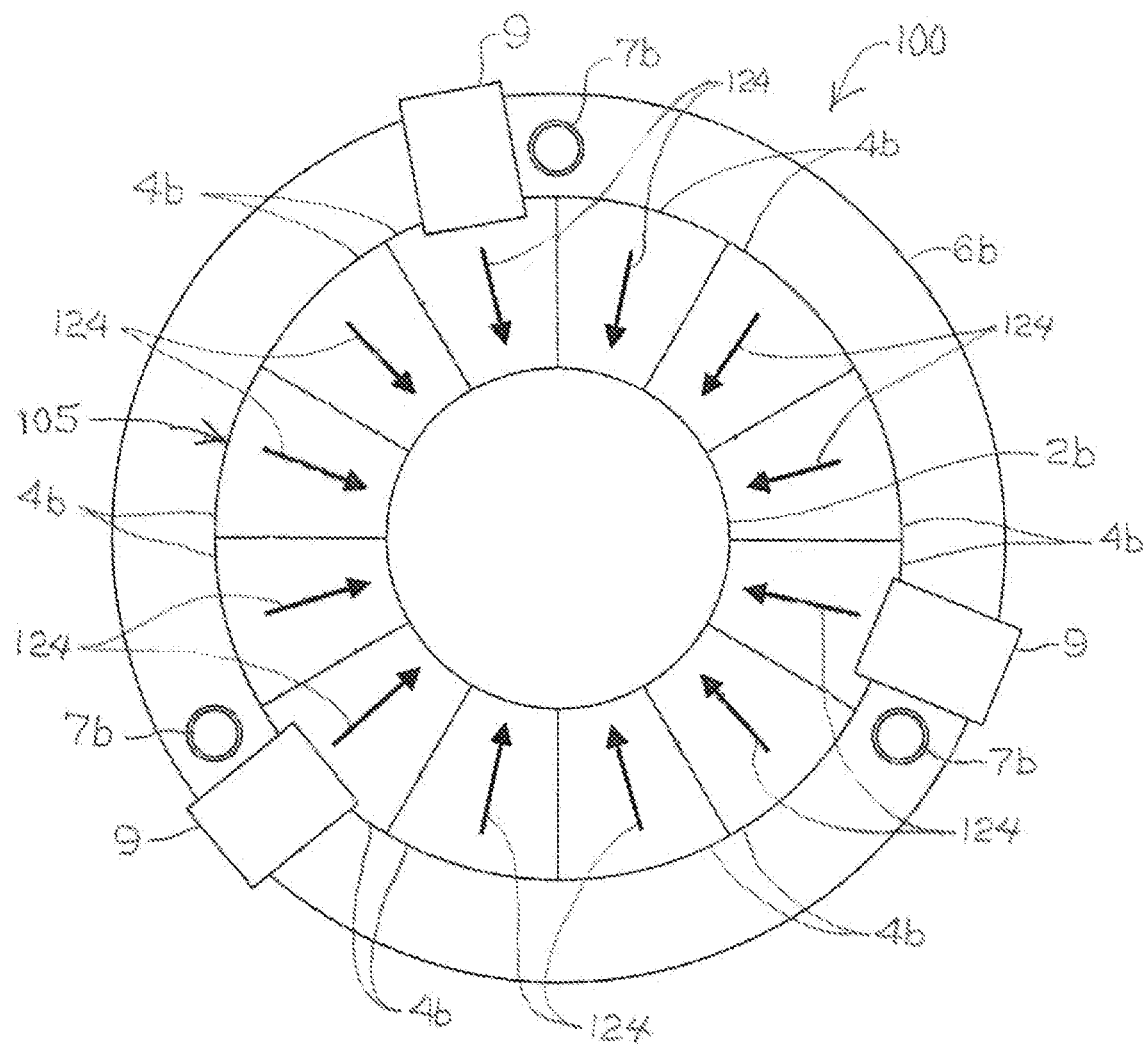
FIG. 9 is a cross-section view of the example magnet assembly taken along the cutting plane line 9-9 in FIG. 2.

FIG. 9 shows a view in the axial direction of the second polarizing assembly 106. In this example magnet assembly 100 embodiment, the second ring magnet 105 comprises twelve (12) second sectors 4b, each with substantially uniform magnetization. Also shown in FIG. 9 is the second pole piece body 2b and the second flux return 6b.

Figure 3:
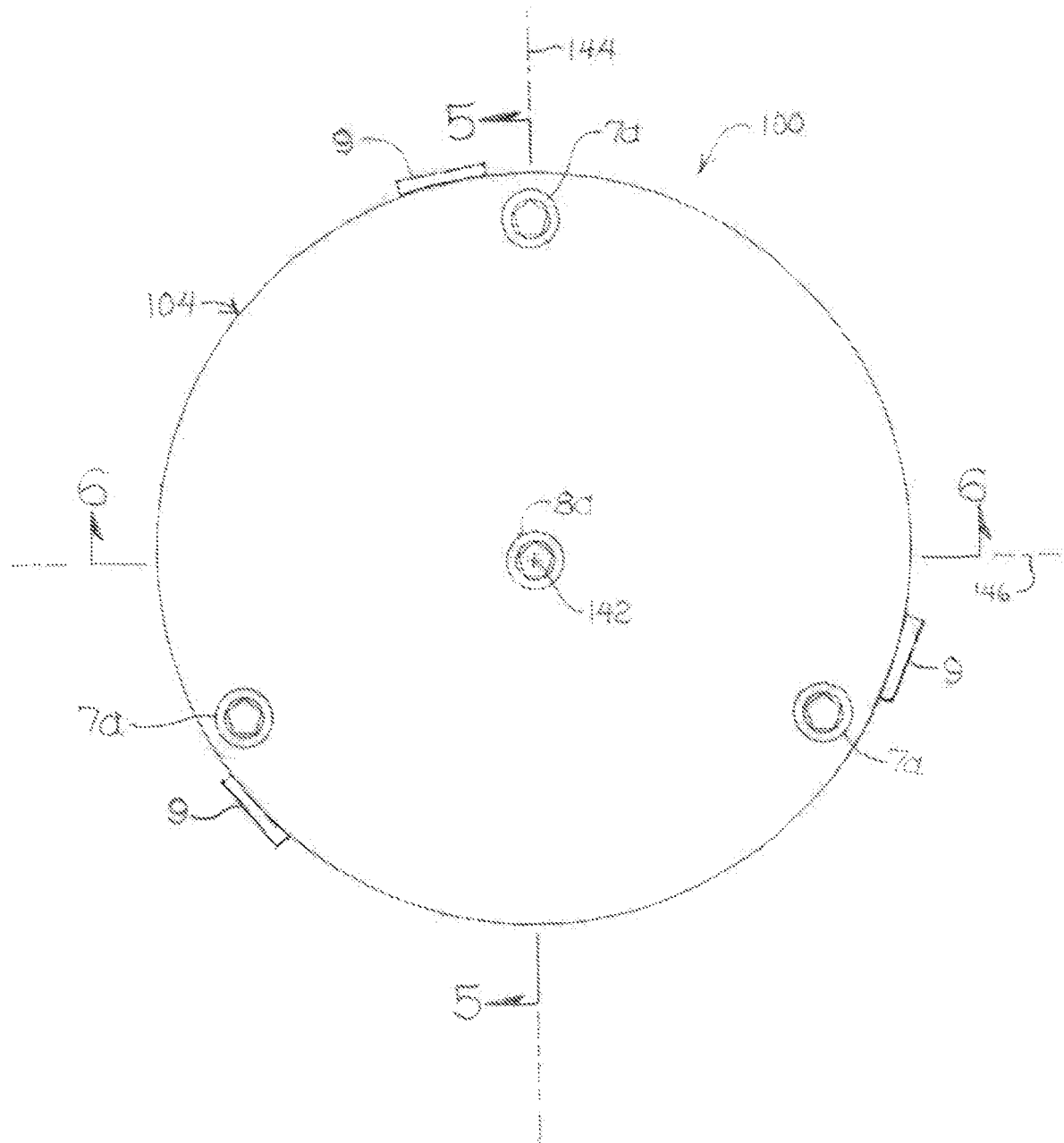
FIG. 3 is a left end elevation view of the example magnet assembly of FIG. 1.

The example magnet assembly 100 comprises two polarizing assemblies 104, 106 and one pole tip assembly 102. These components are each rigid and stable assemblies that may be constructed separately. To provide adjustment of the field gradients, shims 9 and jack screws 7a, 7b are provided as means to adjust the positions of each polarizing assembly 104, 106 in relation to the pole tip assembly 102. FIGS. 1 and 3 show three jack screws 7a and three shims 9 in a tripod configuration, i.e., space angularly 120 degrees from each other in relation to the longitudinal axis 142. Other embodiments can have a different number of jack screws and shims. Contact between the pole tip assembly 102 and each polarizing assembly 104, 106, respectively, occurs only at the shims 9 and at the tips of the jack screws 7a, 7b. A gap is provided between the pole piece tip 1a and the pole piece body 2a, and a similar gap is provided between the pole tip 1b and pole piece body 2b, so that the pole piece tips 1a, 1b are not in contact with the respective adjacent pole piece bodies 2a, 2b. The jack screws are used to slightly separate the flux returns 6a, 6b from the flux return center section 11 as shown by the gaps 110 and 112 in FIG. 1, so that shims 9 of various thicknesses can be inserted or removed. Strong attractive axial magnetic forces are present when the three assemblies 102, 104, 106 are brought together, so that the whole forms a rigid assembly.

The jack screws 7a, 7b and shims 9 can be used to adjust the magnetic field gradients. For one example, if the first polarizing assembly 104 is slightly withdrawn by increasing the thickness of all three shims 9, thus the gap 110, between the first polarizing assembly 104 and the pole tip assembly 102, the gap between the first pole piece tip 1a and the first pole piece body 2a will increase, thus reducing the power of the first polarizing assembly 104 to withdraw flux from the pole tip assembly 102. Thus the magnetic field in the space 103 between the pole piece tip faces 160, 162 will tend to be stronger on the right side than on the left side of the space 103 and a gradient in the axial direction increasing to the right will be created. For another example, if the shim 9 at the top of FIG. 4 between the first polarizing assembly 104 and the pole tip assembly 102 is made thicker, the first pole piece body 2a will tilt, thus change the shape of the gap 110, so that the first pole piece body 2a will be less effective at withdrawing flux from the top side of the pole tip assembly 102, and a transverse gradient increasing toward the bottom of the space 103 between the pole tip faces 160, 162 will be created. Similarly, adjustments to the size and shape of the gap 112 between the second pole piece body 2b and the pole tip assembly 102 by adjusting the jack screws 7b, which also affect the axial or transverse gradients or both in the space 103 between the pole tip faces 160, 162.

Gradient adjustments made as described above are much less sensitive than gradient adjustments made by changing the relative positions of the two pole piece faces 160, 162. For example, for the embodiment illustrated in FIG. 4, the sensitivity of transverse gradients to tilt or lack of parallelism between the first pole piece tip 1a and the first pole piece body 2a or between the second pole piece tip 1b and the second pole piece body 2b is about 30 times less than the sensitivity to tilt or lack of parallelism between the pole tip faces 160, 162.

In the example magnet assembly 100 shown FIGS. 1-9 and described above, each polarizing assembly 104, 106 comprises both axially and radially magnetized permanent magnet material, a soft magnetic pole piece body, and soft magnetic flux return. This particular arrangement of soft and hard magnetic materials is not essential to the disclosed invention. Many other arrangements of hard and soft magnetic material can be used to withdraw flux from one side of the pole tip assembly 102 and insert it into the other side of the pole tip assembly 102.

In the example magnet assembly 100 shown in FIGS. 1-9, a portion of the flux return, i.e., the flux return center section 11, is included in the pole piece tip assembly 102, but this is not an essential feature of the disclosed invention. Alternately the flux returns 6a and 6b could be extended to meet one another and there could be no part of the flux return in the pole tip assembly. In such an alternative embodiment, the jack screws 7a, 7b would bear against the opposite flux return 6a, 6b, respectively, or against opposing jack screws 7a, 7b, or one set of the jack screws in one of the polarizing assemblies 106, for example, the jack screws 7b in the second polarizing assembly 106, could be eliminated, or vice versa. Also, in such an alternative embodiment, the optional shims 9 would then be positioned between the first flux return 6a and the second flux return 6b.

In the example magnet assembly 100 embodiment shown in FIGS. 1-9, jack screws and shims are used to control the relative positions between the polarizing assemblies 104, 106 and the pole tip assembly 102. Other adjusting means for adjusting and controlling these positions can be used.

The example magnet assembly 100 and the associated improved field homogeneity are of particular value at fields above 2 Tesla, where the pole tips are partly or fully saturated. However, the magnet assembly described above can also be used advantageously at lower fields to improve homogeneity.

Other alternative embodiments are also possible. For example, the pole piece bodies 2a, 2b could be eliminated, and the respective pole piece tips 1a, 1b could be extended to very close proximity to the respective disk magnets 3a, 3b. In another embodiment, the pole piece bodies 2a, 2b could be eliminated and replaced, for example, with disk magnets. In each of such alternatives, as in the example magnet assembly 100 described above, the spacing 103 between the first and second pole piece tips 1a, 1b remains the same and is not changed when adjustments are made in either the spacing between the first polarizing assembly 104 and the first pole tip 1b or the spacing between the second polarizing assembly 106 and the second pole tip 1b to adjust the magnetic field gradients in the space between the pole piece tips 1a, 1b.

The description above illustrates several advantages provided by the example magnet assembly 100, including the following: (a) The pole tips are combined into an assembly that rigidly and permanently fixes the relative position of the two poles tips, which makes the most critical dimensions in the disclosed magnet design stable over time and able to survive mechanical shocks; (b) The pole tip assembly is not subject to magnetic forces when it is manufactured, making it easier to achieve and verify the high mechanical tolerances that are required; (c) Field gradients are adjusted by changing the relative position between the pole tip assembly and two polarizing assemblies, and these adjustments are much less sensitive than corresponding adjustments of the relative positions of the two pole tips, which makes them very stable over time and more able to survive mechanical shock; (d) The disclosed gradient adjusting means can be used in the completed magnet assembly while the field inhomogeneity is being measured; (e) The disclosed gradient adjusting means can be advantageously used with saturated or unsaturated pole tips; and (f) The disclosed gradient adjusting means can be advantageously used with polarizing assemblies containing axially and radially magnetized permanent magnets, or only axially polarized magnets, or other configurations of permanent magnets.

Accordingly, resort may be made to all suitable combinations, subcombinations, modifications, and equivalents that fall within the scope of the invention as defined by the features. The words "comprise," "comprises," "comprising," "include," "including," and "includes" when used in this specification, including the claims, are intended to specify the presence of stated features, integers, components, or steps, but they do not preclude the presence or addition of one or more other features, integers, components, steps, or groups thereof. Directional terms used in this description, including, for example, left, right, vertical, horizontal, top, bottom, and the like are with reference to the orientation of the magnet assembly 100 in the drawing sheets, not with regard to any particular orientation of the magnet assembly 100 in actual use.

What is claimed is:

1. A permanent magnet assembly comprising:
   (a) a pole tip assembly comprising two pole tips of magnetic material, disposed symmetrically with respect to a mirror plane between them, and a pole tip mount of rigid material, whereby said pole tips and pole tip mount together comprise a rigid assembly,
   (b) a first polarizing assembly comprising permanent magnets disposed to draw magnetic flux out of a first side of said pole tip assembly, and an enclosing magnetic flux return disposed to guide flux into a second polarizing assembly,
   (c) said second polarizing assembly comprising permanent magnets disposed to insert magnetic flux into a second side of said pole tip assembly, and an enclosing magnetic flux return disposed to guide flux out of said first polarizing assembly,
   (d) adjusting means whereby the position of said first polarizing assembly and the position of said second polarizing assembly can be adjusted relative to the position of said pole tip assembly,
   whereby said adjusting means improves the homogeneity of the magnetic field in the region between said symmetrically disposed pole tips.

2. The permanent magnet of claim 1 wherein said first and second polarizing assemblies comprise axially magnetized permanent magnets.

3. The permanent magnet of claim 1 wherein said first and second polarizing assemblies comprise axially magnetized permanent magnets and radially magnetized permanent magnets.

4. The permanent magnet of claim 1 wherein said pole tips are magnetically saturated in at least some regions.

5. Magnet apparatus, comprising:
- a first magnet and a second magnet positioned adjacent to each other and aligned with each other in a manner that produces a magnetic flux along a longitudinal axis that extends through both the first magnet and the second magnet;
- a first pole piece with a first pole piece face and a second pole piece with a second pole piece face, wherein the first pole piece and the second pole piece are positioned between the first magnet and the second magnet with the first pole piece face and the second pole piece face facing each other a spaced distance apart from each other in the magnetic flux along the longitudinal axis so that there is a space between the first pole piece face and the second pole piece face, and wherein there is a first gap between the first magnet and the first pole piece face and there is a second gap between the second magnet and the second pole piece face; and
- adjusting means for adjusting the size or shape of the first gap or the second gap.

6. The magnet apparatus of claim 5, wherein:
- the first pole piece comprises a first pole piece body and a first pole piece tip, and the first gap is between the first pole piece body and the first pole piece tip; and
- the second pole piece comprises a second pole piece body and a second pole piece tip, and the second gap is between the second pole piece body and the second pole piece tip.

7. The magnet apparatus of claim 5, wherein the first pole piece tip and the second pole piece tip are fixed in immovable relation to each other so that the space between the first pole piece face and the second pole piece face is fixed in size and shape.

8. The magnet apparatus of claim 5, wherein the first magnet is a permanent first magnet, and the second magnet is a permanent second magnet.

9. A method of providing a magnetic field, comprising:
creating a magnetic flux along an axis;
- positioning a first pole piece comprising a first pole piece body and a first pole piece tip that has a first pole piece tip face in the magnetic flux with a first gap between the first pole piece body and the first pole piece tip;
- positioning a second pole piece comprising a second pole piece body and a second pole piece tip that has a second pole piece tip face in the magnetic flux with a second gap between the second pole piece body and the second pole piece tip;
- positioning the first pole piece and the second pole piece in the magnetic flux with the first pole piece tip face and the second pole piece face facing each other with a space between the first pole piece tip face and the second pole piece tip face; and
- adjusting homogeneity of the magnetic flux in the space between the first pole piece tip face and the second pole piece tip face by varying the first gap or by varying the second gap or by varying both the first gap and the second gap.

10. The method of claim 9, including varying the first gap by moving the first pole piece body in relation to the first pole piece tip.

11. The method of claim 9, including varying the second gap by moving the second pole piece body in relation to the first pole piece tip.

12. The method of claim 10, including varying the first gap by moving the first pole piece body along a longitudinal axis toward or away from the first pole piece tip.

13. The method of claim 10, including varying the first gap by rotating the first pole piece body in relation to the first pole piece tip about an orthogonal axis.

14. The method of claim 11, including varying the second gap by moving the second pole piece body along a longitudinal axis toward or away from the second pole piece tip.

15. The method of claim 11, including varying the second gap by rotating the second pole piece body in relation to the second pole piece tip about an orthogonal axis.

* * * * *